United States Patent
Ueda et al.

(10) Patent No.: US 12,007,414 B2
(45) Date of Patent: Jun. 11, 2024

(54) SEMICONDUCTOR TEST APPARATUS AND SEMICONDUCTOR TEST METHOD

(71) Applicant: Mitsubishi Electric Corporation, Tokyo (JP)

(72) Inventors: Yoshiyuki Ueda, Tokyo (JP); Takaya Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 39 days.

(21) Appl. No.: 17/456,682

(22) Filed: Nov. 29, 2021

(65) Prior Publication Data
US 2022/0244292 A1 Aug. 4, 2022

(30) Foreign Application Priority Data
Feb. 1, 2021 (JP) .................................. 2021-014321

(51) Int. Cl.
*G01R 1/073* (2006.01)
*G01R 1/04* (2006.01)
(Continued)

(52) U.S. Cl.
CPC ..... *G01R 1/07342* (2013.01); *G01R 31/2601* (2013.01); *G01R 31/2886* (2013.01); *H01L 22/30* (2013.01)

(58) Field of Classification Search
CPC .......... G01R 1/04; G01R 1/067; G01R 1/073; G01R 31/26; G01R 31/28; G01R 31/2887
See application file for complete search history.

(56) References Cited

U.S. PATENT DOCUMENTS 6,084,215 A * 7/2000 Furuya .............. H01L 21/67248
219/448.11
2005/0005702 A1* 1/2005 Osuga ................. H01L 21/6838
73/760
(Continued)

FOREIGN PATENT DOCUMENTS

JP 2014-195016 A 10/2014
JP 2015-026765 A 2/2015
JP 2017027974 * 2/2017 ........... H01L 21/683

OTHER PUBLICATIONS

An Office Action; "Notice of Reasons for Refusal," mailed by the Japanese Patent Office on Jan. 30, 2024, which corresponds to Japanese Patent Application No. 2021-014321 and is related to U.S. Appl. No. 17/456,682; with English language translation.

*Primary Examiner* — Neel D Shah
(74) *Attorney, Agent, or Firm* — Studebaker & Brackett PC

(57) ABSTRACT

A semiconductor test apparatus includes a chuck top on which a semiconductor wafer is mounted, and contact probes that contact measurement points of semiconductor chips formed on the semiconductor wafer, the chuck top includes a conductor that contacts a lower surface of the semiconductor wafer, a mounting table arranged below the conductor, and a first vacuum tube and a second vacuum tube connected to the mounting table, the conductor has a plurality of suction holes that are arranged in a spiral form in top view, in the mounting table, a flow pass communicating with the plurality of suction holes and having a spiral form in top view, the first vacuum tube is connected to an inner circumference portion of the flow pass, and the second vacuum tube is connected to an outer circumference portion of the flow pass.

7 Claims, 8 Drawing Sheets

(51) Int. Cl.
    *G01R 1/067*     (2006.01)
    *G01R 31/26*     (2020.01)
    *G01R 31/28*     (2006.01)
    *H01L 21/66*     (2006.01)

(56) References Cited

U.S. PATENT DOCUMENTS

| | | |
|---|---|---|
| 2015/0028907 A1 | 1/2015 | Shinohara et al. |
| 2018/0252765 A1* | 9/2018 | Nagashima ......... G01R 1/07314 |
| 2022/0115252 A1* | 4/2022 | Noji ................... H01L 21/6838 |

* cited by examiner

SEMICONDUCTOR TEST APPARATUS AND SEMICONDUCTOR TEST METHOD

BACKGROUND OF THE INVENTION

Field of the Invention

The present disclosure relates to a semiconductor test apparatus and a semiconductor test method.

Description of the Background Art

A probe device has been proposed for improving the measurement accuracy and power consumption efficiency of electrical characteristic inspection for a power device (corresponding to a semiconductor wafer) having electrodes on both sides of a semiconductor substrate by materializing the reduction in contact resistance and uniformity of contact resistance between a rear side electrode of a semiconductor substrate and the mounting surface conductor of the chuck top on which the semiconductor substrate is mounted (see, for example, Japanese Patent Application Laid-Open No. 2015-26765).

However, in the technique described in Japanese Patent Application Laid-Open No. 2015-26765, a semiconductor wafer is sucked through the vacuum passage; therefore, the pressure loss increases in proportion to the length of the vacuum passage. Therefore, while the suction force at the central portion of the chuck top having a short vacuum passage is maximized, at portions closer toward the outer circumferential side of the check top, the suction force becomes lower, causing a variation in suction force within the plane of the semiconductor wafer. There has been a problem that the measurement accuracy of the semiconductor test lowers as a result of the variation in contact resistance between the semiconductor wafer and the chuck top.

SUMMARY

An object of the present disclosure is to provide a technique capable of suppressing lowering in measurement accuracy due to a variation in contact resistance between a semiconductor wafer and a chuck top in a semiconductor test.

The semiconductor test apparatus according to the present disclosure includes a chuck top and contact probes. On the chuck top, a semiconductor wafer is mounted. The contact probes contact measurement points of semiconductor chips formed on the semiconductor wafer. The chuck top includes a conductor, a mounting table, and a first vacuum tube and a second vacuum tube. The conductor contacts the lower surface of the semiconductor wafer. The mounting table is arranged below the conductor. The first vacuum tube and the second vacuum tube are connected to the mounting table. The conductor has a plurality of suction holes arranged in a spiral form in top view. On the mounting table, a flow pass communicating with the plurality of suction holes and having a spiral form in top view is formed. The first vacuum tube is connected to an inner circumference portion of the flow pass, and the second vacuum tube is connected to an outer circumference portion of the flow pass.

Accordingly, the first vacuum tube sucks from the inner circumference portion of the flow pass; therefore, the suction force decreases as it goes from the inner circumference portion toward the outer circumference side of the flow pass. Meanwhile, the second vacuum tube sucks from the outer circumference portion of the flow pass; therefore, the suction force decreases as it goes from the outer circumference portion toward the inner circumference side of the flow pass.

Consequently, the variation in the suction force in the plane of the semiconductor wafer becomes small, and the variation in the contact resistance between the semiconductor wafer and the chuck top also becomes small. As a result, in the semiconductor test, the suppression of lowering in measurement accuracy due to a variation in the contact resistance between the semiconductor wafer and the chuck top is ensured.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
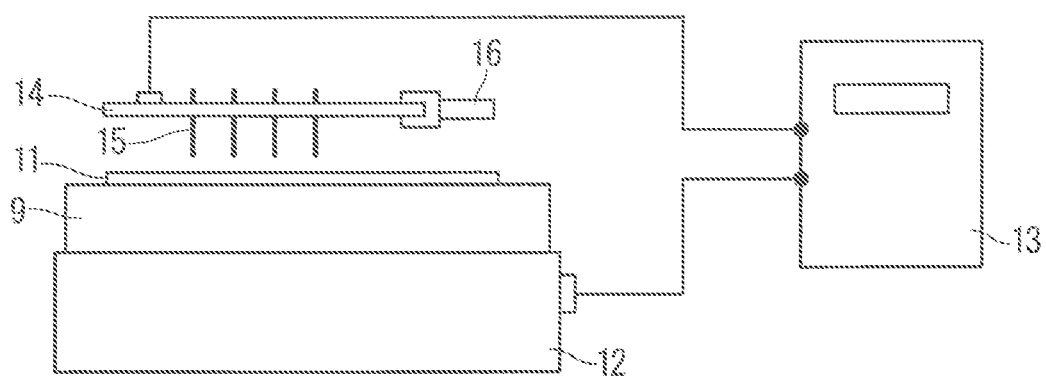
FIG. 1 is a schematic view of a semiconductor test apparatus according to Embodiment 1.

Hereinafter, Embodiment 1 will be described with reference to the drawings. FIG. 1 is a schematic view of a semiconductor test apparatus according to Embodiment 1.

As illustrated in FIG. 1, the semiconductor test apparatus includes a chuck stage 12, a chuck top 9, a tester 13, a test jig 14, contact probes 15, and a transfer arm 16. The semiconductor test apparatus further includes a control unit (not illustrated) that controls each part of the semiconductor test apparatus, a transport hand (not illustrated) for mounting a semiconductor wafer 11 on the chuck top 9, a sensor (not illustrated) for capturing features of the semiconductor wafer 11. Here, the control unit is, for example, a processor.

The chuck top 9 is mounted on the upper surface of the chuck stage 12. The semiconductor wafer 11 subject to the semiconductor test is placed on the upper surface of the chuck top 9.

The test jig 14 is held by the transfer arm 16 so as to be located above the semiconductor wafer 11. The contact probes 15 are fixed to the test jig 14 and moveable with the transfer operation of the transfer arm 16. The contact probes 15 are, for example, spring probes, wire probes, measuring needles, or the like, and may be the ones that are surface-treated by such as gold plating.

The contact probes 15 and the tester 13 are electrically connected. With the contact probes 15 being in contact with the measurement points of the semiconductor chip (not illustrated) formed on the semiconductor wafer 11, the tester 13 measures the electrical characteristics of the semiconductor chip via the contact probes 15, and determines whether or not the semiconductor chip is a defective product based on the measurement result.

Figure 2:
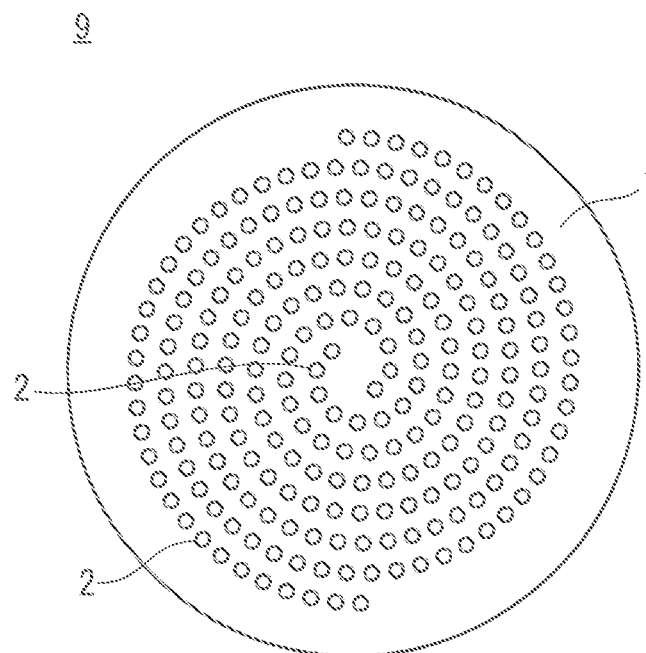
FIG. 2 is a top view of a chuck top included in the semiconductor test apparatus according to Embodiment 1.
Figure 3:
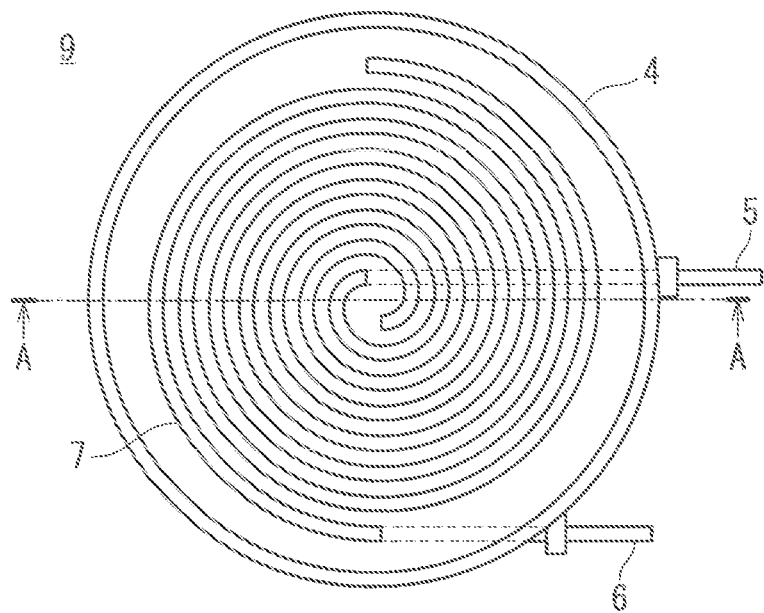
FIG. 3 is a top view of the chuck top included in the semiconductor test apparatus according to Embodiment 1 as viewed from above a mounting table.
Figure 4:
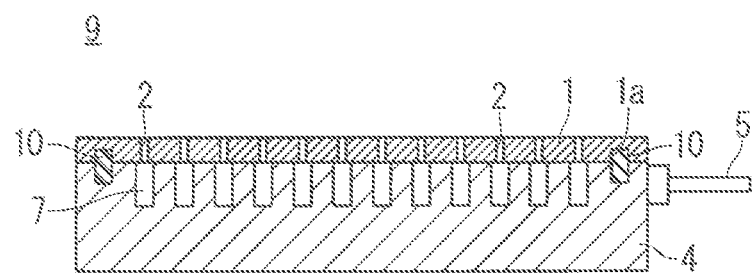
FIG. 4 is a cross-sectional view taken along the line A-A of FIG. 3.

Next, the configuration of the chuck top 9 will be described with reference to FIGS. 2 to 4. FIG. 2 is a top view of the chuck top 9. FIG. 3 is a top view of the chuck top 9 as viewed from above a mounting table 4. FIG. 4 is a cross-sectional view taken along the line A-A of FIG. 2.

As illustrated in FIGS. 2 to 4, the chuck top 9 includes a conductor 1, the mounting table 4, a vacuum tube 5, and a vacuum tube 6. Here, the vacuum tube 5 corresponds to a first vacuum tube, and the vacuum tube 6 corresponds to a second vacuum tube. Although the vacuum tube 5 and the vacuum tube 6 are not illustrated in FIG. 2, the description thereof will be made assuming that the vacuum tube 5 and the vacuum tube 6 are present.

The conductor 1 is formed in a disk shape and has an upper surface that contacts the lower surface of the semiconductor wafer 11. The mounting table 4 is formed in a short columnar shape and is arranged below the conductor 1. The conductor 1 has a plurality of suction holes 2 formed therein. The plurality of suction holes 2 are circular holes of the same size, and are arranged in a spiral form in top view. In the mounting table 4, a flow pass 7 communicating with the plurality of suction holes 2 and having a spiral form in top view is formed. The flow pass 7 is formed so as to face the plurality of suction holes 2. Further, the cross-sectional areas of the flow pass 7 of the inner circumferential side are the same as that of the outer circumferential side thereof. That is, the depth of the flow pass 7 of the inner circumferential side is the same as that of the outer circumferential side thereof.

A plurality of positioning pins 10 are provided, in a state of protruding upward, on the upper surface of the mounting table 4 on the outer circumferential side out from the flow pass 7. Further, at positions on the lower surface of the conductor 1 facing the plurality of positioning pins 10, a plurality of holes 1a into which the plurality of positioning pins 10 are inserted are formed. When the conductor 1 is placed on the mounting table 4 with the plurality of positioning pins 10 positioned in the plurality of holes 1a, air sucked through the plurality of suction holes 2 flows through the flow pass 7 due to the communication of the plurality of suction holes 2 and the flow pass 7. Note that in FIG. 3, the positioning pins 10 are not illustrated.

The conductor 1 and the mounting table 4 are made of a conductive material such as oxygen-free copper, pure copper, iron-based metal, or aluminum. Further, the conductor 1 and the mounting table 4 may be subjected to a surface treatment such as gold plating.

As illustrated in FIG. 3, one end portion of the vacuum tube 5 passes through the side surface of the mounting table 4 and is connected to the inner circumference portion of the flow pass 7 (specifically, an end of the inner circumference portion of the flow pass 7) formed in the mounting table 4. One end portion of the vacuum tube 6 passes through the side surface of the mounting table 4 and is connected to the outer circumference portion of the flow pass 7 (specifically, an end of the outer circumference portion of the flow pass 7) formed in the mounting table 4. Further, the other end portions of the vacuum tube 5 and the vacuum tube 6 are connected to, for example, a vacuum pump (not illustrated).

First, when air is sucked from the vacuum tube 5, it is sucked from the inner circumference portion toward the outer circumference portion of the flow pass 7. That is, the semiconductor wafer 11 is sucked from the inner circumference portion toward the outer circumference portion; therefore, the wrinkles generated on the semiconductor wafer 11 are stretched, and the semiconductor wafer 11 is adsorbed to the upper surface of the conductor 1. Next, when air is sucked from the vacuum tube 6, it is sucked from the outer circumference portion toward the inner circumference portion of the flow pass 7, so that the semiconductor wafer 11 is sucked more strongly on the upper surface of the conductor 1.

The suction force of the vacuum tube 5 is highest at the central portion of the conductor 1, which is the inner circumference portion of the conductor 1. Since the pressure loss increases in proportion to the length of the flow pass 7, the suction force of the vacuum tube 5 becomes lower toward the outer circumferential side of the conductor 1. On the other hand, the suction force of the vacuum tube 6 is maximized at the outer circumference portion of the conductor 1. Then, the pressure loss increases in proportion to the length of the flow pass 7, the suction force becomes lower toward the center side of the conductor 1. Consequently, the difference in suction force between the central portion and the outer circumference portion of the conductor 1 is reduced, so that the variation in suction force within the plane of the semiconductor wafer 11 is reduced. As a result, the contact resistance between the semiconductor wafer 11 and the conductor 1 becomes uniform, improving the measurement accuracy of the semiconductor test.

Figure 5:
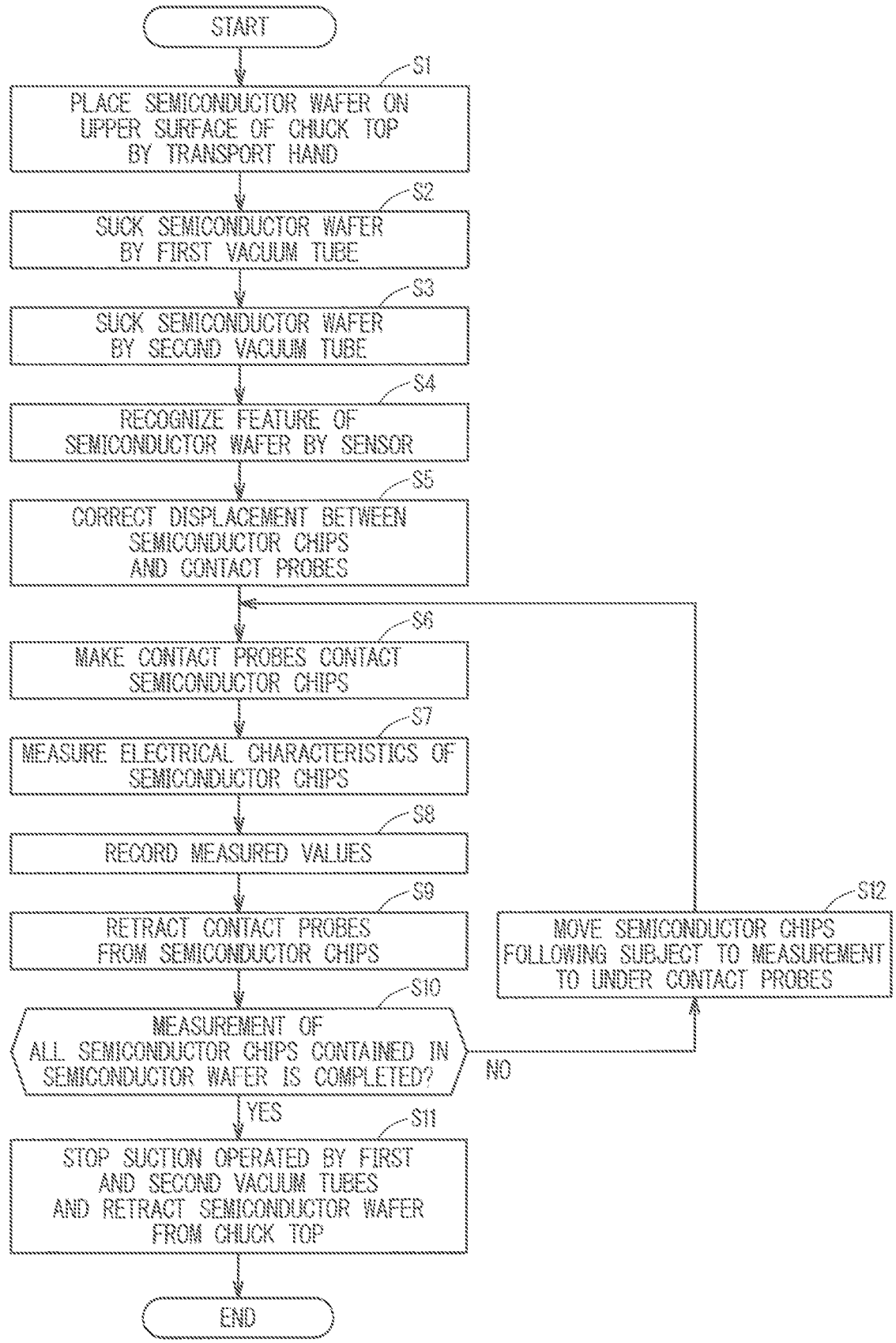
FIG. 5 is a flowchart for a semiconductor test method according to Embodiment 1.

Next, the semiconductor test method will be described with reference to FIG. 5. FIG. 5 is a flowchart for a semiconductor test method.

As illustrated in FIG. 5, first, the control unit (not illustrated) causes the transport hand (not illustrated) to place the semiconductor wafer 11 on the upper surface of the chuck top 9 (Step S1). Then, when the control unit starts suction from the vacuum tube 5, the semiconductor wafer 11 is sucked from the inner circumference portion toward the outer circumference portion (Step S2). Next, when the control unit starts suction from the vacuum tube 6, the semiconductor wafer 11 is sucked from the outer circumference portion toward the inner circumference portion (Step S3). As a result, the semiconductor wafer 11 is adsorbed to and held by the chuck top 9.

As described above, by starting suction from the vacuum tube 5 before the vacuum tube 6, the semiconductor wafer 11 is first sucked from the inner circumference portion to the outer circumference portion, so that the effect of stretching wrinkles generated on the semiconductor wafer 11 is obtained.

Next, the control unit recognizes, as a feature of the semiconductor wafer 11, a feature such as electrode pads or the like of a plurality of semiconductor chips formed on the semiconductor wafer 11 by a sensor (not illustrated) such as a camera (Step S4). The control unit calculates the amount of displacement between the electrode pads of the semiconductor chips and the contact probes 15 and corrects the amount of displacement (Step S5). The control unit moves the transfer arm 16 based on the corrected amount of displacement to align the positions of the contact probes 15 with respect to the electrode pads of the semiconductor chips and brings the tips of the contact probes 15 into contact with the measurement points of the semiconductor chips (Step S6).

The control unit confirms that the contact probes 15 and the measurement points of the semiconductor chips are electrically connected, and applies a voltage or current to the semiconductor chips by the tester 13 to measure the electrical characteristics of the semiconductor chips (Step S7), and record measured values (Step S8). Here, the measured values may be recorded in a storage unit provided on the semiconductor chips, or may be recorded in a storage unit provided outside the semiconductor test apparatus.

Next, the control unit moves the transfer arm 16 to retract the contact probes 15 from the semiconductor chips (Step S9), and then determines whether or not the measurement of all the semiconductor chips contained in the semiconductor wafer 11 is completed (Step S10). When the measurement of all the semiconductor chips is not completed (Step S10: NO), the control unit moves the chuck stage 12 to move the semiconductor chips following subject to the measurement on the chuck top 9 to under the contact probes 15 (Step S12), and then the step proceeds to Step S6.

On the other hand, when the measurement of all the semiconductor chips is completed (Step S10: YES), the control unit stops the suction from the vacuum tube 5 and the vacuum tube 6, and then causes the transport hand to transfer the semiconductor wafer 11 from the chuck top 9 (Step S11), and the process ends.

As described above, in Embodiment 1, the semiconductor test apparatus includes the chuck top 9 on which the semiconductor wafer 11 is mounted, and the contact probes 15 that contact the measurement points of the semiconductor chips formed on the semiconductor wafer 11, the chuck top 9 includes the conductor 1 that contacts the lower surface of the semiconductor wafer 11, the mounting table 4 arranged below the conductor 1, and the vacuum tube 5 and vacuum tube 6 connected to the mounting table 4, the conductor 1 has a plurality of suction holes 2 that are arranged in a spiral form in top view, in the mounting table 4, In the mounting table 4, the flow pass 7 communicating with the plurality of suction holes 2 and having a spiral form in top view, the vacuum tube 5 is connected to the inner circumference portion of the flow pass 7, and the vacuum tube 6 is connected to the outer circumference portion of the flow pass 7.

Also, the semiconductor test method includes a step (a) mounting the semiconductor wafer 11 on the chuck top 9, a step (b) sucking the semiconductor wafer 11 by the vacuum tube 5, and sucking the semiconductor wafer 11 by the vacuum tube 6, and a step (c) bringing the contact probes 15 into contact with the measurement portions of the semiconductor chips to measure the electrical characteristics of the semiconductor chips.

Accordingly, the vacuum tube 5 sucks from the inner circumference portion of the flow pass 7; therefore, the suction force decreases as it goes from the inner circumference portion toward the outer circumference side of the flow pass 7. Meanwhile, the vacuum tube 6 sucks from the outer circumference portion of the flow pass 7; therefore, the suction force decreases as it goes from the outer circumference portion toward the inner circumference side of the flow pass 7.

Consequently, the variation in the suction force in the plane of the semiconductor wafer 11 becomes small, and the variation in the contact resistance between the semiconductor wafer 11 and the chuck top 9 also becomes small. As a result, in the semiconductor test, the suppression of lowering in measurement accuracy due to a variation in the contact resistance between the semiconductor wafer 11 and the chuck top 9 is ensured. From the above, the yield of the semiconductor chips is improved.

Further, the step (b) is a step of sucking the semiconductor wafer 11 by the vacuum tube 5, and then sucking the semiconductor wafer 11 by the vacuum tube 6; therefore, by starting suction from the vacuum tube 5 before the vacuum tube 6, the semiconductor wafer 11 is first sucked from the inner circumference portion to the outer circumference portion, allowing stretching of wrinkles generated on the semiconductor wafer 11.

Embodiment 2

Figure 6:
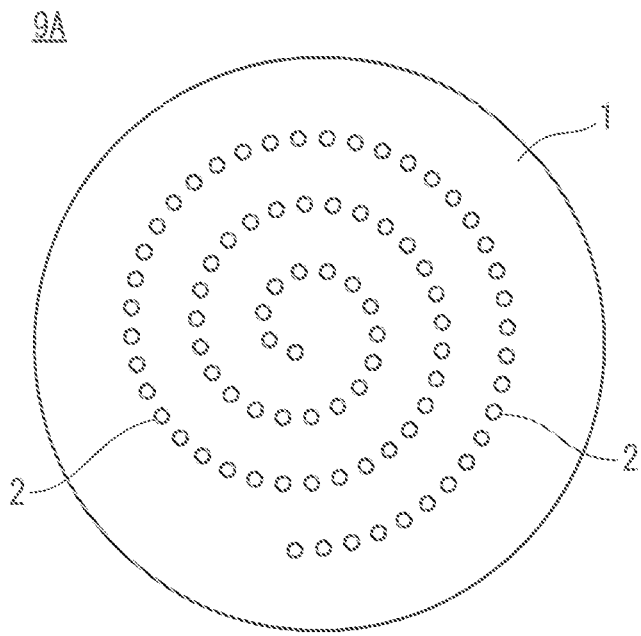
FIG. 6 is a top view of a chuck top included in a semiconductor test apparatus according to Embodiment 2.
Figure 7:
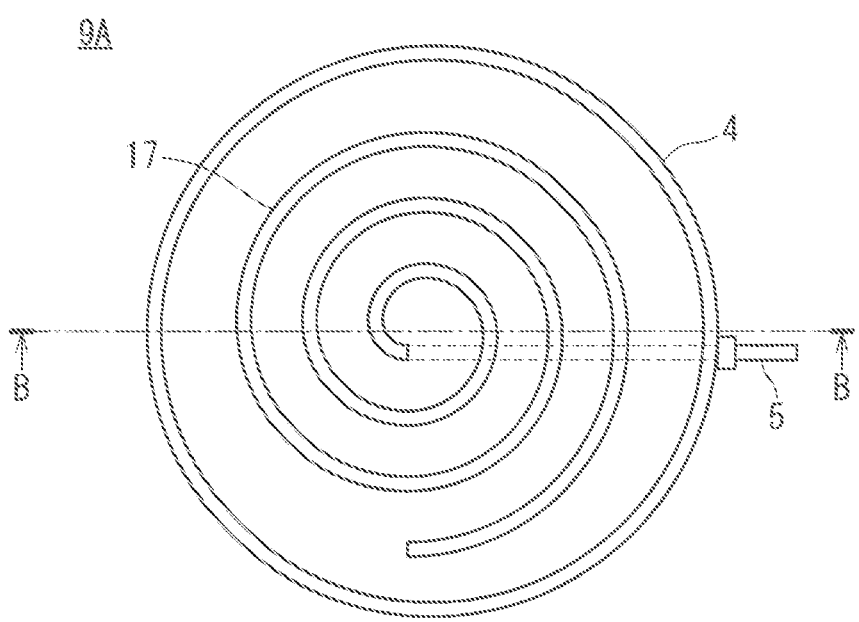
FIG. 7 is a top view of the chuck top included in the semiconductor test apparatus according to Embodiment 2 as viewed from above a mounting table.
Figure 8:
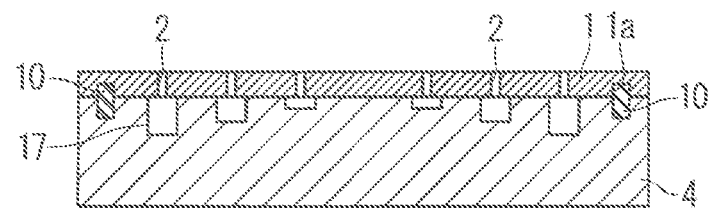
FIG. 8 is a cross-sectional view taken along the line B-B of FIG. 7.

Next, a semiconductor test apparatus according to Embodiment 2 will be described. FIG. 6 is a top view of a chuck top 9A included in a semiconductor test apparatus according to Embodiment 2. FIG. 7 is a top view of the chuck top 9A as viewed from above the mounting table 4. FIG. 8 is a cross-sectional view taken along the line B-B of FIG. 7. In Embodiment 2, the same components as those described in Embodiment 1 are designated by the same reference numerals, and the description thereof is omitted.

In Embodiment 1, the vacuum tube 6 connected to the outer circumference portion of the flow pass 7 is provided, however, as illustrated in FIGS. 6 to 8, in Embodiment 2, the chuck top 9A is provided with the conductor 1, the mounting table 4 and the vacuum tube 5, and the vacuum tube 6 is not provided.

Further, in the mounting table 4, instead of the flow pass 7, a flow pass 17 communicating with the plurality of suction holes 2 and having a spiral form in top view is formed. The flow pass 17 is formed so as to face the plurality of suction holes 2. One end portion of the vacuum tube 5 passes through the side surface of the mounting table 4 and is connected to the inner circumference portion of the flow pass 17 (specifically, an end of the inner circumference portion of the flow pass 17) formed in the mounting table 4.

Although the plurality of suction holes 2 are arranged in a spiral form in top view as in the case of Embodiment 1, the number of the suction holes 2 is smaller than that in the case of Embodiment 1.

Further, the cross-sectional shapes of the flow pass 17 are larger on the outer circumferential side than on the inner circumferential side. Specifically, the depth of the flow pass 17 is deeper on the outer circumferential side than on the inner circumferential side. Consequently, the pressure loss that increases in proportion to the length of the flow pass 17 become uniform.

In terms of a semiconductor test method, processes are performed that are the same processes as those illustrated in FIG. 5 from which Step S3 and the process related to the second vacuum tube in Step 11 are excluded; therefore the description thereof is omitted.

As described above, in Embodiment 2, the semiconductor test apparatus includes the chuck top 9A on which the semiconductor wafer 11 is mounted, and the contact probes 15 that contact the measurement points of the semiconductor chips formed on the semiconductor wafer 11, the chuck top 9A includes the conductor 1 that contacts the lower surface of the semiconductor wafer 11, the mounting table 4 arranged below the conductor 1, and the vacuum tube 5 connected to the mounting table 4, the conductor 1 has a plurality of suction holes 2 that are arranged in a spiral form in top view, in the mounting table 4, In the mounting table 4, the flow pass 17 communicating with the plurality of suction holes 2 and having a spiral form in top view, the vacuum tube 5 is connected to the inner circumference portion of the flow pass 17, and the cross-sectional shapes of the flow pass 17 are larger on the outer circumferential side than on the inner circumferential side.

Also, the semiconductor test method includes a step (d) mounting the semiconductor wafer 11 on the chuck top 9A, a step (e) sucking the semiconductor wafer 11 by the vacuum tube 5, and a step (f) bringing the contact probes 15 into contact with the measurement portions of the semiconductor chips to measure the electrical characteristics of the semiconductor chips.

Accordingly, the pressure loss that increases in proportion to the length of the flow pass 17 becomes uniform; therefore, the variation in the suction force in the plane of the semiconductor wafer 11 becomes small, and the variation in the contact resistance between the semiconductor wafer 11 and the chuck top 9A also becomes small. As a result, in the semiconductor test, the suppression of lowering in measurement accuracy due to a variation in the contact resistance between the semiconductor wafer 11 and the chuck top 9A is ensured.

Embodiment 3

Figure 9:
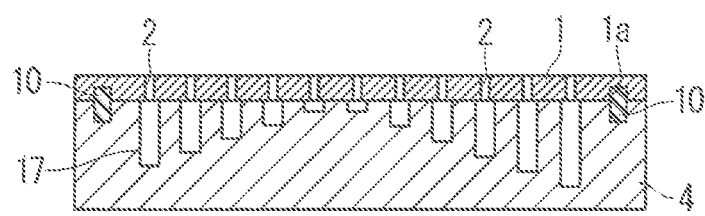
FIG. 9 is a diagram of Embodiment 3, corresponding to FIG. 8.

Next, a semiconductor test apparatus according to Embodiment 3 will be described. FIG. 9 is a diagram of Embodiment 3, corresponding to FIG. 8. In Embodiment 3, the same components as those described in Embodiments 1 and 2 are designated by the same reference numerals, and the description thereof is omitted.

In Embodiment 3, a chuck top 9B includes the conductor 1, the mounting table 4, the vacuum tube 5, and the vacuum tube 6 as in the case of Embodiment 1. In Embodiment 1, the cross-sectional areas of the flow pass 7 are the same on the inner peripheral side and the outer peripheral side, however, as illustrated in FIG. 9, in the mounting table 4, instead of the flow pass 7, a flow pass 17 communicating with the plurality of suction holes 2 and having a spiral form in top view is formed in Embodiment 3. The cross-sectional shapes of the flow pass 17 are larger on the outer circumferential side than on the inner circumferential side; therefore, the pressure loss that increases in proportion to the length of the flow pass 17 becomes uniform.

The connection relationship between the flow pass 17 and the vacuum tube 5 and the vacuum tube 6 is the same as the connection relationship between the flow pass 7 and the vacuum tube 5 and the vacuum tube 6 in Embodiment 1; therefore, the description thereof is omitted.

Further, the description of the semiconductor test method is omitted because of the same processes as those of Embodiment 1.

As described above, in Embodiment 3, the vacuum tube 5 sucks the semiconductor wafer 11 from the inner circumference portion of the flow pass 17, and the vacuum tube 6 sucks the semiconductor wafer 11 from the outer circumference portion of the flow pass 17; therefore, the variation in the suction force in the plane of the semiconductor wafer 11 becomes small. Further, the cross-sectional areas of the flow pass 17 are larger on the outer circumferential side than on the inner circumferential side; therefore, the pressure loss that increases in proportion to the length of the flow pass 17 becomes uniform.

Consequently, the effect of reducing the variation in suction force in the plane of the semiconductor wafer 11 is enhanced more than that in the case of Embodiment 1; therefore, the further suppression of lowering in measurement accuracy due to a variation in the contact resistance between the semiconductor wafer 11 and the chuck top 9 is ensured, in the semiconductor test.

Embodiment 4

Figure 10:
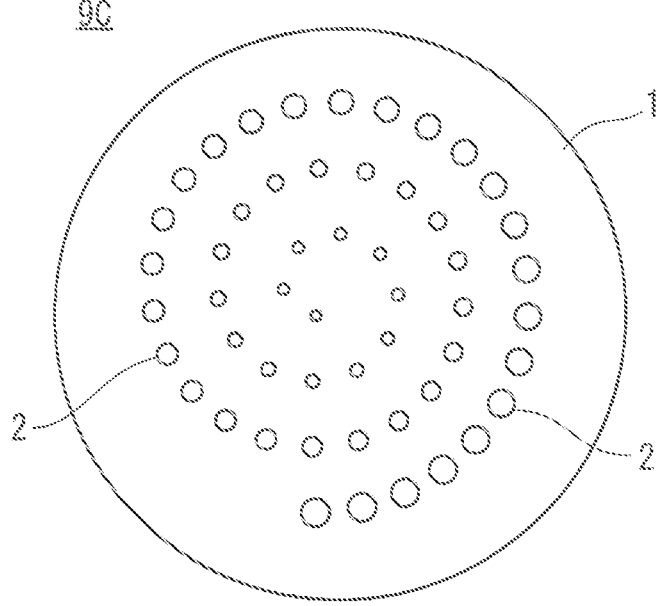
FIG. 10 a top view of a chuck top included in a semiconductor test apparatus according to Embodiment 4.
Figure 11:
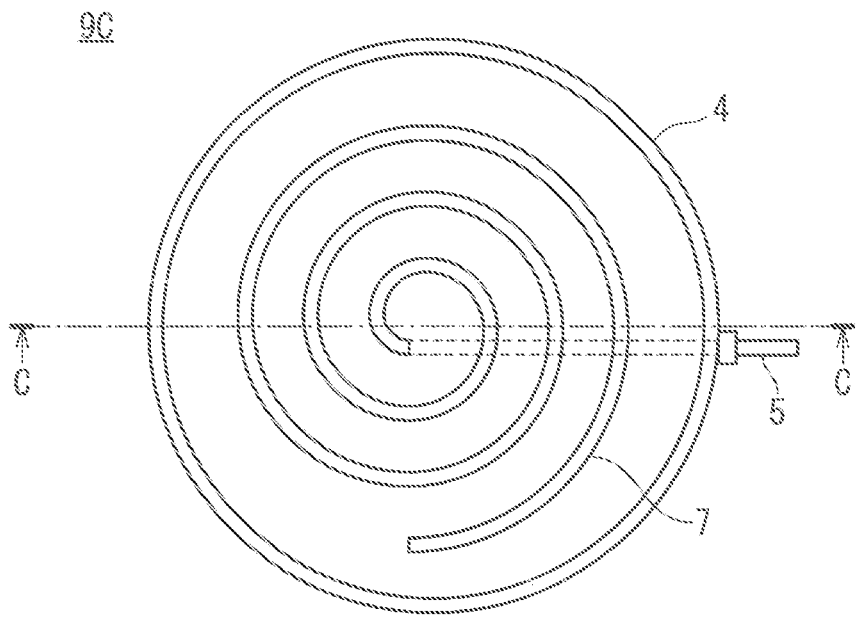
FIG. 11 is a top view of the chuck top included in the semiconductor test apparatus according to Embodiment 4 as viewed from above a mounting table.
Figure 12:
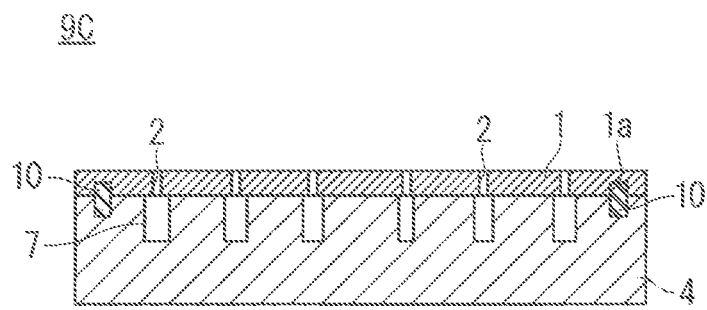
FIG. 12 is a cross-sectional view taken along the line C-C of FIG. 11.

Next, a semiconductor test apparatus according to Embodiment 4 will be described. FIG. 10 is a top view of a chuck top 9C included in a semiconductor test apparatus according to Embodiment 4. FIG. 11 is a top view of the chuck top 9C as viewed from above the mounting table 4. FIG. 12 is a cross-sectional view taken along the line C-C of FIG. 11. In Embodiment 4, the same components as those described in Embodiments 1 to 3 are designated by the same reference numerals, and the description thereof is omitted.

As illustrated in FIGS. 10 to 12, in Embodiment 4, the chuck top 9C includes the conductor 1, the mounting table 4, and the vacuum tube 5 as in the case of Embodiment 2, however, the plurality of suction holes 2 formed in the conductor 1 have sizes that are larger on the outer circumferential side than on the inner circumferential side. That is, the sizes of the plurality of suction holes 2 gradually increase from the inner circumferential portion toward the outer circumferential portion of the conductor 1. Further, the cross-sectional shapes of the flow pass 7 are the same as that of the outer peripheral side thereof.

While the cross-sectional shapes of the flow pass 7 are the same, the sizes of the plurality of suction holes 2 are larger on the outer circumferential side than on the inner circumferential side; therefore, the pressure loss that increases in proportion to the length of the flow pass 7 becomes uniform.

Further, the description of the semiconductor test method is omitted because of the same processes as those of Embodiment 2.

As described above, in Embodiment 4, the sizes of the plurality of suction holes 2 are larger on the outer circumferential side than on the inner circumferential side; therefore, the pressure loss that increases in proportion to the length of the flow pass 7 becomes uniform. As a result, the variation in suction force within the plane of the semiconductor wafer 11 becomes small, and the variation in contact resistance between the semiconductor wafer 11 and the chuck top 9C also becomes small. As a result, in the semiconductor test, the suppression of lowering in measurement accuracy due to a variation in the contact resistance between the semiconductor wafer 11 and the chuck top 9C is ensured.

Embodiment 5

Figure 13:
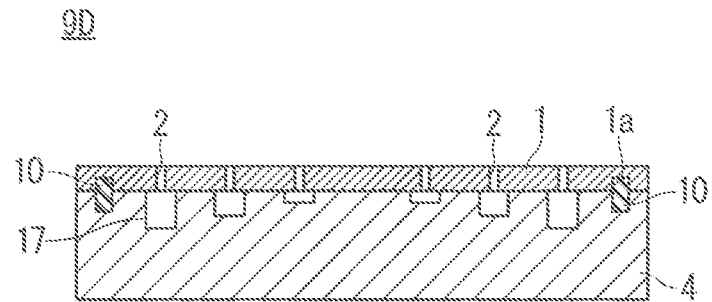
FIG. 13 is a diagram of Embodiment 5, corresponding to FIG. 12.

Next, a semiconductor test apparatus according to Embodiment 5 will be described. FIG. 13 is a diagram of Embodiment 5, corresponding to FIG. 12. In Embodiment 5, the same components as those described in Embodiments 1 to 4 are designated by the same reference numerals, and the description thereof is omitted.

As illustrated in FIG. 13, in Embodiment 5, a chuck top 9D includes the conductor 1, the mounting table 4, and the vacuum tube 5 as in the case of Embodiment 4, however, a flow pass 17, instead of the flow pass 7, is provided in the mounting table 4. Further, in Embodiment 5, in addition to the sizes of the plurality of suction holes 2 being larger on the outer circumferential side than on the inner circumferential side, the cross-sectional areas of the flow pass 17 are larger on the outer circumferential side than on the inner circumferential side.

Further, the description of the semiconductor test method is omitted because of the same processes as those of Embodiment 2.

As described above, in Embodiment 5, in addition to the sizes of the plurality of suction holes 2 being larger on the outer circumferential side than on the inner circumferential side, the cross-sectional areas of the flow pass 17 are larger on the outer circumferential side than on the inner circumferential side; therefore, the effect of reducing the variation in the suction force in the plane of the semiconductor wafer 11 is enhanced further, compared with the case of Embodiment 4, and in the semiconductor test, the further suppression of lowering in measurement accuracy due to a variation in the contact resistance between the semiconductor wafer 11 and the chuck top 9 is ensured.

The conductor 1 in which the plurality of suction holes 2 formed in Embodiments 4 and 5 is applicable to the semiconductor test apparatus according to Embodiment 1. In such a case, the effect of reducing the variation in suction force in the plane of the semiconductor wafer 11 is enhanced more than that in the case of Embodiment 4; therefore, the further suppression of lowering in measurement accuracy due to a variation in the contact resistance between the semiconductor wafer 11 and the chuck top is ensured, in the semiconductor test.

Embodiment 6

Figure 14:
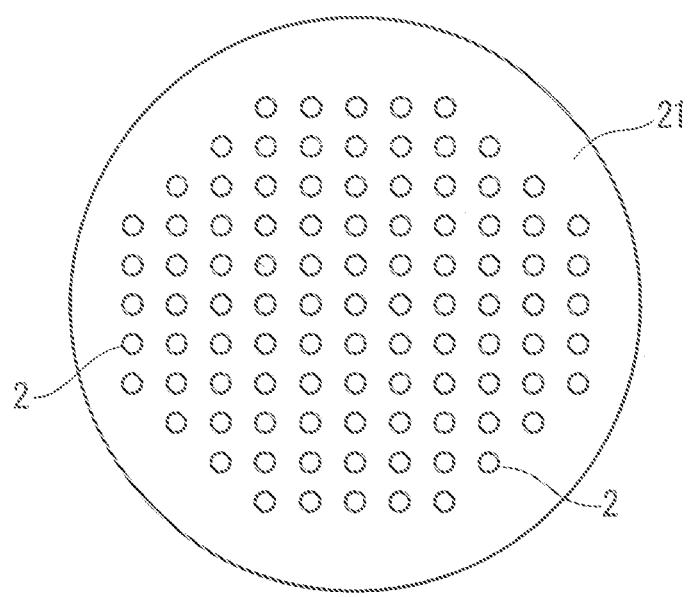
FIG. 14 a top view of a chuck top included in a semiconductor test apparatus according to Embodiment 6.
Figure 15:
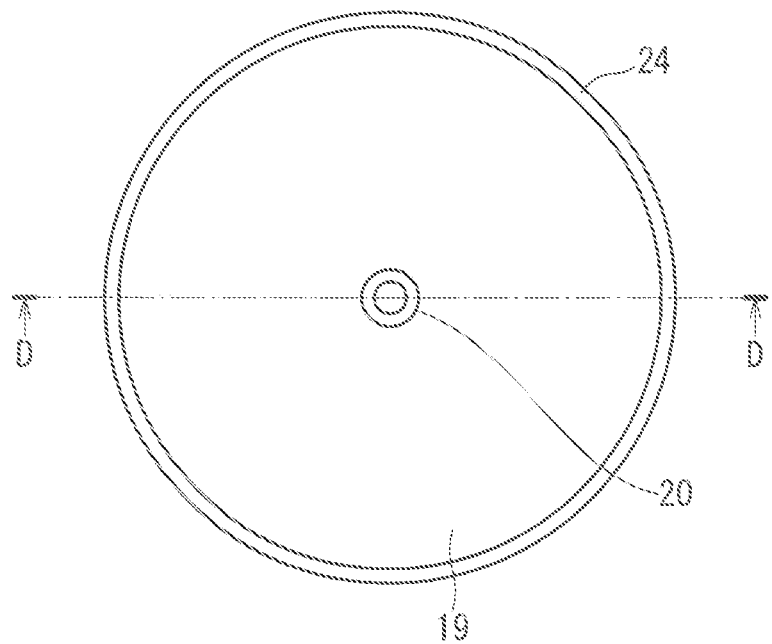
FIG. 15 is a top view of the chuck top included in the semiconductor test apparatus according to Embodiment 6 as viewed from above a mounting table.
Figure 16:
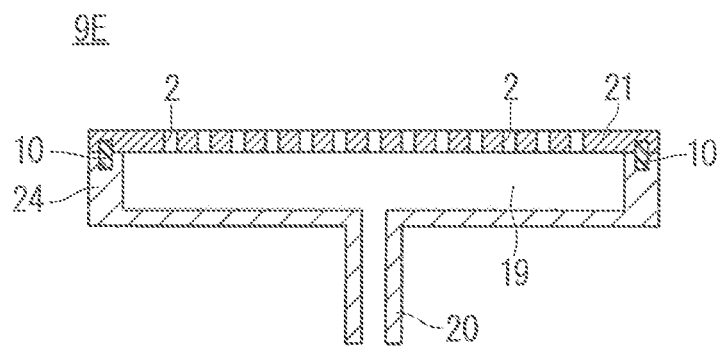
FIG. 16 is a cross-sectional view taken along the line D-D of FIG. 15.

Next, a semiconductor test apparatus according to Embodiment 6 will be described. FIG. 14 is a top view of a chuck top 9E included in a semiconductor test apparatus according to Embodiment 6. FIG. 15 is a top view of the chuck top 9E as viewed from above a mounting table 24. FIG. 16 is a cross-sectional view taken along the line D-D of FIG. 15. In Embodiment 6, the same components as those described in Embodiments 1 to 5 are designated by the same reference numerals, and the description thereof is omitted.

As illustrated in FIGS. 14 to 16, in Embodiment 6, the chuck top 9E includes a conductor 21, the mounting table 24, and a vacuum tube 20.

The conductor 21 is formed in a disk shape and has an upper surface that contacts the lower surface of the semiconductor wafer 11. The mounting table 24 is formed in a short columnar shape and is arranged below the conductor 21. The conductor 21 has the plurality of suction holes 2 formed therein. The plurality of suction holes 2 are circular holes of the same size, and are arranged in a region thereof other than the outer circumferential portion. That is, the plurality of suction holes 2 are arranged in a substantially circular shape when viewed from above.

In the mounting table 24, one cavity 19 that communicates with a plurality of suction holes 2 is formed. The cavity 19 is formed in a portion other than the outer circumferential portion of the mounting table 24.

The plurality of positioning pins 10 are provided, in a state of protruding upward, on the upper surface of the mounting table 24 on the outer circumferential side out from the cavity 19 (that is, the circumference portion of the mounting table 24). Note that in FIG. 15, the positioning pins 10 are not illustrated.

The conductor 21 and the mounting table 24 are made of a conductive material such as oxygen-free copper, pure copper, iron-based metal, or aluminum. Further, the conductor 21 and the mounting table 24 may be subjected to a surface treatment such as gold plating.

The mounting table 24 and the vacuum tube 20 are formed integrally. One end portion of the vacuum tube 20 passes through the central portion of a bottom surface of the mounting table 24 and is connected to the cavity 19. Accordingly, one end portion of the vacuum tube 20 communicates with the plurality of suction holes 2 through the cavity 19. Further, the other end portion of the vacuum tube 20 is connected to, for example, a vacuum pump (not illustrated).

When air is sucked from the vacuum tube 20 connected to the central portion of the bottom surface of the mounting table 24, the air sucked from the plurality of suction holes 2 flows toward the vacuum tube 20 through the entire cavity 19. Consequently, the difference in suction force between the central portion and the outer circumference portion of the conductor 21 is reduced, so that the variation in suction force within the plane of the semiconductor wafer 11 is reduced.

Further, the description of the semiconductor test method is omitted because of the same processes as those of Embodiment 2.

As described above, in Embodiment 6, the semiconductor test apparatus includes the chuck top 9E on which the semiconductor wafer 11 is mounted, and the contact probes 15 that contact the measurement points of the semiconductor chips formed on the semiconductor wafer 11, the chuck top 9E includes the conductor 21 that contacts the lower surface of the semiconductor wafer 11, the mounting table 24 arranged below the conductor 21, and the vacuum tube 20 connected to the mounting table 24, the conductor 21 has the plurality of suction holes 2 formed therein, in the mounting table 24, the cavity 19 that communicates with a plurality of suction holes 2 is formed, and the vacuum tube 20 communicates with the plurality of suction holes 2 through the cavity 19.

Therefore, the air sucked from the plurality of suction holes 2 flows toward the vacuum tube 20 through the entire cavity 19, so that the variation in the suction force within the plane of the semiconductor wafer 11 becomes small. As a result, a variation in the contact resistance between the semiconductor wafer 11 and the chuck top 9E becomes small; therefore, in the semiconductor test, the suppression of lowering in measurement accuracy due to a variation in the contact resistance between the semiconductor wafer 11 and the chuck top 9E is ensured.

Embodiment 7

Figure 17:
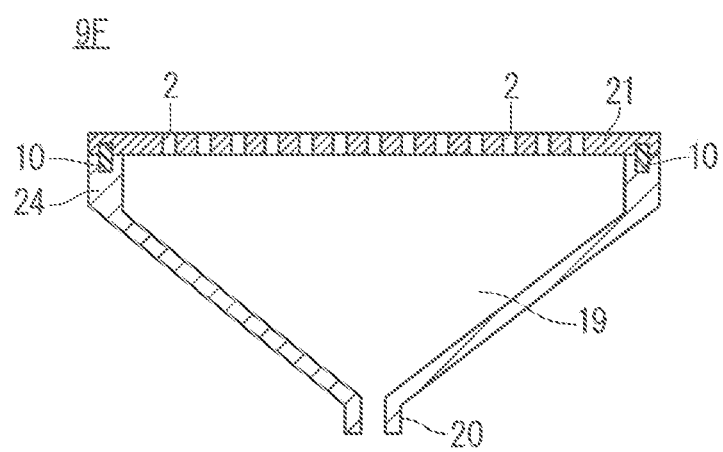
FIG. 17 is a diagram of Embodiment 7, corresponding to FIG. 16.

Next, a semiconductor test apparatus according to Embodiment 7 will be described. FIG. 17 is a diagram of Embodiment 7, corresponding to FIG. 16. In Embodiment 7, the same components as those described in Embodiments 1 to 6 are designated by the same reference numerals, and the description thereof is omitted.

As illustrated in FIG. 17, the chuck top 9F includes the conductor 21, the mounting table 24, and the vacuum tube 20. In Embodiment 7, the shape of the mounting table 24 is different from that in Embodiment 6.

The mounting table 24 is circular in top view and has a tapered shape in which the lower end portion is thinner than the upper end portion in cross-sectional view. The mounting table 24 and the vacuum tube 20 are formed integrally, and the whole shape is formed into a funnel-like shape.

One end portion of the vacuum tube 20 passes through the central portion of a bottom surface of the mounting table 24 and is connected to the cavity 19. Accordingly, one end portion of the vacuum tube 20 communicates with the plurality of suction holes 2 through the cavity 19. Further, the other end portion of the vacuum tube 20 is connected to, for example, a vacuum pump (not illustrated).

Further, the description of the semiconductor test method is omitted because of the same processes as those of Embodiment 6.

As described above, in Embodiment 7, the mounting table 24 has a tapered shape in which the lower end portion is thinner than the upper end portion in cross-sectional view, so that the distance the sucked air flows from each suction hole 2 and reaches the vacuum tube 20 can be made substantially the same. Consequently, the variation in the suction force in the plane of the semiconductor wafer 11 becomes smaller, and the variation in the contact resistance between the semiconductor wafer 11 and the chuck top 9 also becomes smaller than that in the case of Embodiment 6. As a result, in the semiconductor test, the suppression of lowering in measurement accuracy due to a variation in the contact resistance between the semiconductor wafer 11 and the chuck top 9 is further ensured than that in the case of Embodiment 6.

The Embodiments can be combined, appropriately modified or omitted.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor test apparatus comprising:
   a chuck top on which a semiconductor wafer is mounted; and
   contact probes that contact measurement points of semiconductor chips formed on the semiconductor wafer, wherein
   the chuck top includes a conductor that contacts a lower surface of the semiconductor wafer, a mounting table arranged below the conductor, and a first vacuum tube and a second vacuum tube connected to the mounting table,
   the conductor has a plurality of suction holes arranged in a spiral form in top view,
   in the mounting table, a flow pass communicating with the plurality of suction holes and having a spiral form in top view is formed,
   the first vacuum tube is connected to an inner circumference portion of the flow pass, and
   the second vacuum tube is connected to an outer circumference portion of the flow pass.

2. The semiconductor test apparatus according to claim 1, wherein
   cross-sectional areas of the flow pass are larger on an outer circumferential side than on an inner circumferential side.

3. The semiconductor test apparatus according to claim 1, wherein
   sizes of the plurality of suction holes are larger on an outer circumferential side than on an inner circumferential side.

4. A semiconductor test method using the semiconductor test apparatus according to claim 1, comprising the steps of:
   (a) mounting the semiconductor wafer on the chuck top;
   (b) sucking the semiconductor wafer by the first vacuum tube, and sucking the semiconductor wafer by the second vacuum tube, and
   (c) bringing the contact probes into contact with the measurement points of the semiconductor chips to measure electrical characteristics of the semiconductor chips.

5. The semiconductor test method according to claim 4, wherein
   the step (b) is a step of sucking the semiconductor wafer by the first vacuum tube, and then sucking the semiconductor wafer by the second vacuum tube.

6. The semiconductor test apparatus according to claim 1, wherein the first vacuum tube is connected to the inner circumference portion of the flow pass such that suction force of the first vacuum tube on the flow pass is highest at the inner circumference portion of the flow pass.

7. The semiconductor test apparatus according to claim 1, wherein the first vacuum tube is connected to the inner circumference portion of the flow pass at a first distance from a center of the spiral form of the flow pass, and
   the first distance is shorter than a minimum distance from the second vacuum tube to the center of the spiral form of the flow pass.

* * * * *